United States Patent [19]

Yamazaki et al.

[11] Patent Number: 4,735,821
[45] Date of Patent: Apr. 5, 1988

[54] METHOD FOR DEPOSITING MATERIAL ON DEPRESSIONS

[75] Inventors: Shunpei Yamazaki, Tokyo; Takashi Inujima, Atsugi, both of Japan

[73] Assignee: Semiconductor Energy Laboratory Co., Ltd., Japan

[21] Appl. No.: 909,203

[22] Filed: Sep. 19, 1986

[30] Foreign Application Priority Data

Sep. 21, 1985 [JP] Japan .................................. 60-209597

[51] Int. Cl.⁴ ............................................. B05D 3/06
[52] U.S. Cl. .................................... 427/54.1; 427/53.1
[58] Field of Search ............................ 427/53.1, 54.1

[56] References Cited

U.S. PATENT DOCUMENTS

| 3,200,018 | 8/1965 | Grossman | 427/82 |
| 4,444,801 | 4/1984 | Hongo et al. | 427/53.1 |
| 4,466,992 | 8/1984 | Dreiling | 427/54.1 |
| 4,624,736 | 11/1986 | Gee et al. | 427/54.1 |

FOREIGN PATENT DOCUMENTS 59-094829  5/1984  Japan .................................. 427/53.1

Primary Examiner—John H. Newsome
Attorney, Agent, or Firm—Gerald J. Ferguson, Jr.; Michael P. Hoffman; Michael J. Foycik, Jr.

[57] ABSTRACT

An improved method for depositing material on substrate is shown. The material to be deposited is energized by irradiation with light in a chamber in which CVD method is carried out. The energy induced by the irradiation remains in the molecules of the material even after the molecules have lain on the substrate. With the residual energy, the molecules can wander on the substrate even to a hidden surface. Due to this wandering, the deposition can be performed also on the inside of a deep cave.

4 Claims, 4 Drawing Sheets

METHOD FOR DEPOSITING MATERIAL ON DEPRESSIONS

BACKGROUND OF THE INVENTION

This invention relates to a method for depositing material on a depression, more particularly, relates to a method in which a photo CVD process is carried out so that the deposition is effectively performed also on insides of depressions.

There are broadly known and used a low pressure CVD, a plasma CVD as chemical vapor deposition method for semiconductor processing. In the semiconductor processing, depressions such as a hole, a trench, a cave (a sub-surface re-entrant opening having surfaces out of line-of-sight) or so on are configured on whose surfaces are placed product of the CVD method to form a buried field insulating layer or an electric element such as a capacitance in the depression, or to fill an over-etching region in the form of a depression. When a formation of layer on the depression is desired, it is inevitable that the thickness of the layer on a inner surface (depression) "ds" and the thickness of the layer on a upper surface "dt" result in ds/dt>1. One of the problems of researching to obtain a finely configured semiconductor in VLSI field is how dt/ds can be increased near 1. Further, in case where the depth of a cave has a measure more than the measure of the opening of the cave, it was impossible to form a uniform layer throughout the inside of the cave. Such caves is formed, e.g., with a known trench method which can dig a cave of depth having a measure 3 to 5 times as large as the measure of the width of the opening thereof. Anyhow, existing methods are not suitable to perform a deposition in such a cave.

Namely, according to an existing CVD method, atoms or molecules are deposited on a substrate under exited condition which are diffused into vapor after decomposed or undergoing a reaction caused by thermal energy. The existing process can be performed effectively when it is carried out under negative pressure, since the active molecules have a relatively long mean free path in the vapor under a negative pressure, compared with that under the atmospheric pressure. For example, on a substrate with a trench of 2 micron meters in width and also in depth, a depression resulted in a layer 1 of micron meter thickness on the upper surface, a layer with at most thickness of 0.7 micron meter on the side wall of the trench and a layer with the thickness of 0.6 micron meter on the bottom of the trench. In any case, a step coverage ds/dt is expected only up to about 0.7.

According to other known method, step coverages are no more than that of the above method. Normaly, ds/dt=0.3-0.5. A plasma enhanced CVD alone is comparable with the above LPCVD.

SUMMARY OF THE INVENTION

The invention has been conceived on the basis of the discovery by the inventor of a phenomenon in which active atoms(molecules) exited by irradiation with light can preserve their active energy, called first energy hereinafter, for relative long time. The active energy of the atom partially remains after the atoms get laid on the substrate, the residual energy being called as the second energy hereinafter.

Whereas undergoing a CVD method, atoms with the first energy are sitting on the atoms with the second energy which are already deposited. According to our experiment, the sitting atoms can wander on the substrate so that the sum of the first energy and the second energy takes less value. The wandering atoms can reach a bare surface of the substrate on which they are stabilized. This means that it is possible to form a layer even on a hidden surface from a principal surface. Further, the phenomenon makes it possible that a layer can be formed according to a new formation theorem which is entirely different from the exiting theorem. According to experiments described in detailed infra, the phenomenon appears as if material is poured into a trench, like liquid.

It is therefore an object of the invention to provide an improved CVD method capable of performing deposition on a depression region.

It is another object of the invention to provide an improved CVD method according to which a thick layer is formed even on depression region.

It is further object of the invention to provide an improved CVD according to which a deposition is established also in the inside of a deep cave.

DETAILED DESCRIPTION OF THE PREFERRED EMBODIMENT

Figure 1:
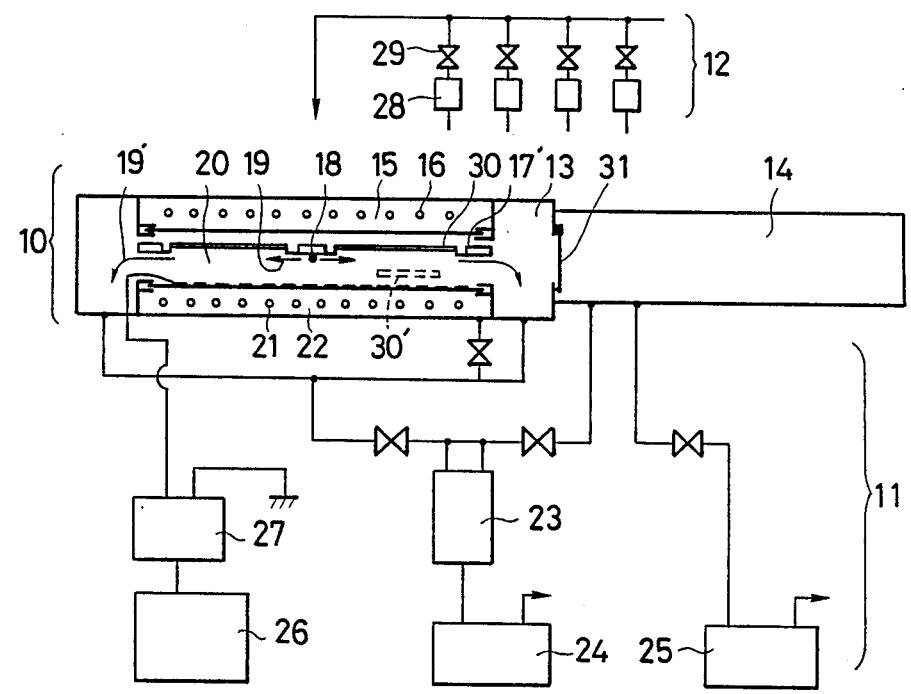
FIG.1 is a schematic diagram showing a CVD device used in methods of the invention.

Referring to FIG.1, an example of a CVD apparatus which is preferrably used for the invention is shown. In the figure, a CVD device comprises a reaction system 10, exhausting system 11 and a reactant gas supply system 12. The reaction system 10 includes a prechamber 14 and a reaction chamber 13, both being evacuated in advance of deposition. First, a plurality of substrates 30 are prepared on which a deposition will be carried out. The substrates are supported on the holder 17 so as to be arranged apart from each other. Then, the plurality of substrate is transferred to the reaction chamber 13 from the prechamber 14 together with the holder 17 through a gate valve 31. In the reaction chamber 13, the substrates 30 are irradiated with ultraviolet light of 184 nm or 254 nm wavelength from a low pressure mercury lamp 21 in a light source chamber 22. The substrate 30 is irradiated with light from the lower side of the substrate 30 and heated from the upper side by a halogen lamp heater 16 provided in a heating chamber 15.

Reactant gas is introduced to the reaction chamber 13 from a gas supply (not shown) via a flow rate meter 28, a valve 29 and a nozzle 18. In the reaction chamber 13, the gas constitutes flows designated with references 19 and 19' in which the gas is exited, made active and decomposed by the ultraviolet light emitted from the lamp 21, and resultant product is deposited on the substrate 30 as a layer.

As reactant gas, mixed gas of polysilane and polyfluorosilane is used for silicon layer. In addition to this reactant gas, an amount of ammonia gas can be further mixed to make a silicon nitride layer. When p-type or n-type semiconductor layer is desired, suitable impurity may be blended. Such reactive gas is introduced with a carrier gas, if necessary.

Further, the reactive gas for silicon layer is mixed with oxide gas to form silicon oxide layer, phosphorous glass or boron glass. Instead of silicon layer, alkylmetal can be introduced to form a metal layer, or alkylmetal and polysilane can be introduced to form a layer composed of metal and silicide.

Figure 2:
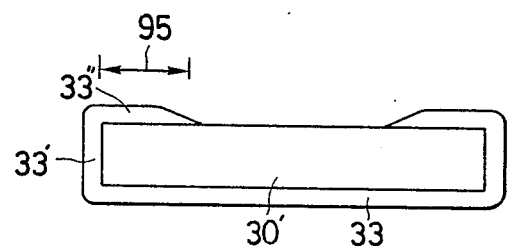
FIG.2 is a section view of the semiconductor device formed in accordance with a first embodiment of the invention.

Referring now to FIG.2, a section view of an experimental product formed by the above method is described to show a first embodiment of the invention. This product was fabricated using a monocrystalline silicon substrate 30' of 15 mm long×20 mm wide×380 micron meters thick. The substrate 30' was disposed in a certain position in the reaction chamber 13 above the mercury lamp 21 and heated up to 200° C. Into the reaction chamber 30 reactant gas was introduced having a composition, $NH_3:Si_2H_6=10:1$, and the substrate 30' was irradiated with u ltraviolet light at 3 torr. Then, as shown in the figure, a silicon nitride layer 33 was formed on the substrate 30' with a thickness of 1000 Å on the bottom and also with a thickness of 1000 Å on the side wall. The noticeable result of the experiment is that the silicon nitride layer 33" was observed also on the upper surface as an extention 35 of 5 mm, whose thickness was measured of 1000 Å on the edge portion having 2 mm width from the side wall of the substrate 30'.

What is further of interest is that the wandering of the deposited materials seem to depend little on the temperature of the substrate 30'. A silicon nitride layer can be formed at less than 400° C. Needless to say, no layer is formed without irradiation even at about 300° C.

Figure 3A:
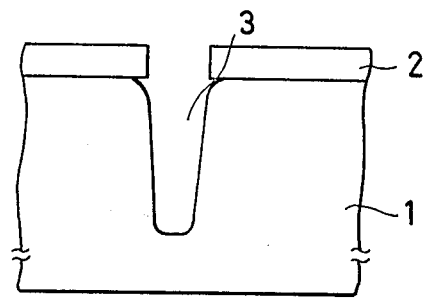
FIGS. 3(A) to 3(C) are fragmentary section views showing a method for depositing a layer on a substrate in accordance with a second embodiment of the invention.
Figure 3B:
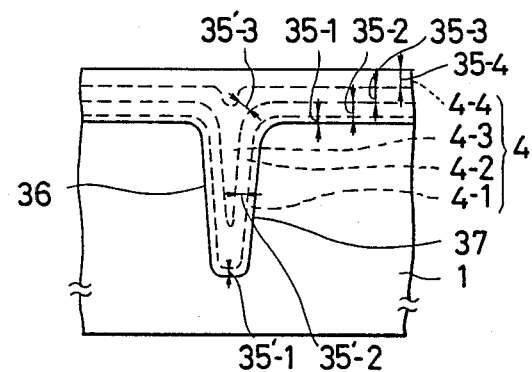
Figure 3C:
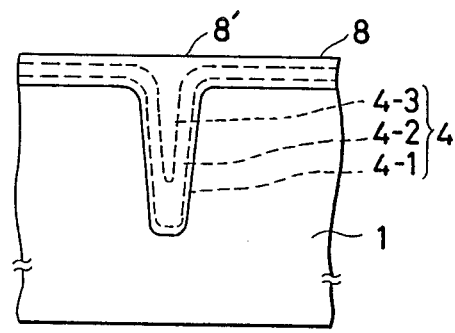

FIGS. 3(A) to 3(C) are fragmentary cross section views showing a second embodiment according to the invention. On a silicon semiconductor substrate 1 is silicon nitride layer 2 which was etched to prepare an opening as a mask for a trench 3. The trench 3 was digged by etching with the nitride layer 2 as a mask.

After removing the silicon nitride layer 2, a silicon oxide layer was deposited on the substrate 1 in accordance with the method explained above in conjunction with FIG. 1. In FIG. 3(B), broken lines 4 are plotted to explain how the silicon nitride layer 36 was grown. The broken lines 4-1 to 4-4 show contours in sequence of the layer growing. The thickness of each layer deposited on each step 35-1 and 35-1', 35-2 and 35-2' . . . or 35-4 was observed uniform throughout the deposited surface including the inside of the trench 3.

Since the uppermost surface of the layer 3 just over the trench tends to be finished in the form of concave, the upper portion of the layer may be removed by isotropic etching to level the surface as shown in FIG. 3(C).

Although this experiment was carried out to form a silicon oxide layer, other layer of silicide such as a silicon nitride layer can be formed according to the similar process such as silicon nitride. Also, after completion of a layer different from a silicon oxide layer, the surface of the layer may be oxidized to form a surface of silicon oxide.

Contrary to existing technique, the CVD according to the invention is carried out at relatively low pressure (about 300° C.) since the bottom of a trench is likely to produce lattice defects therein at a high temperature. The layer thus formed, however, has a very fine structure comparable with a layer conventionally formed at higher than 1000° C.

Figure 4A:
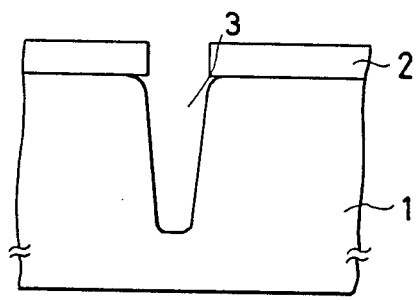
FIGS. 4(A) to (C) are fragmentary section views showing a third embodiment of the invention.
Figure 4B:
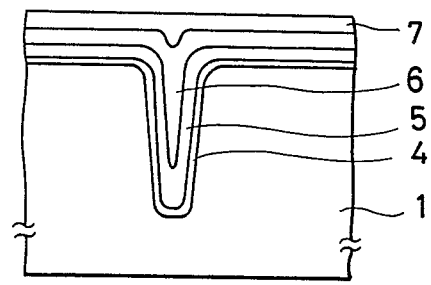
Figure 4C:
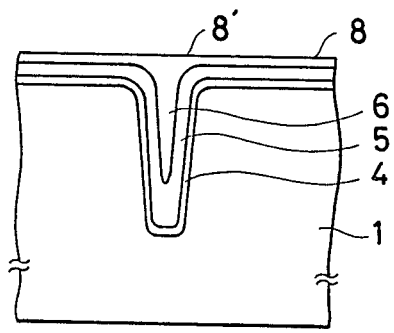

Referring to FIGS. 4(A) to 4(C), a third embodiment is shown. The embodiment includes an extrinsic semiconductor. The process is substantially identical to the preceding embodiment so that redundant descriptions will not be repeated. On a silicon semiconductor are silicon oxide or silicon nitride layer 4, a polysilicon or amorphous silicon layer which is doped with phosphorus as an impurity or metalic conductive layer 5 such as of titanium chloride or tungsten, and a silicon oxide layer 6. In this configuration, a capacitance is constituted between the the semiconductor substrate 1 and the conductive layer 6.

Figure 5A:
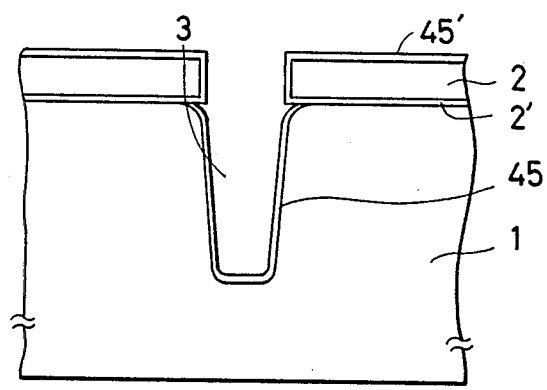
FIG. 5(A) to (C) are fragmentary section views showing a a fourth embodiment of the invention.
Figure 5B:
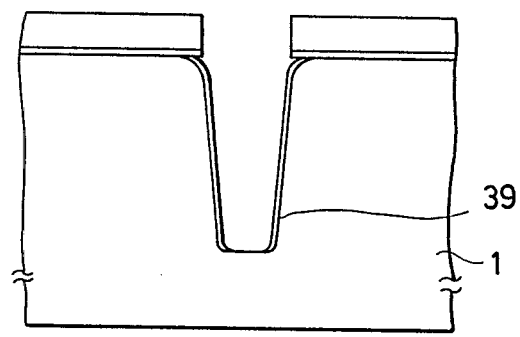
Figure 5C:
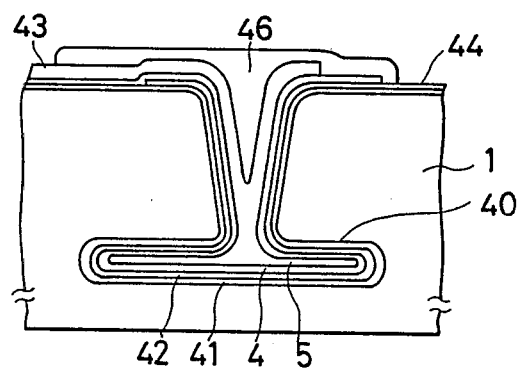

A fourth embodiment of the invention is shown in FIGS. 5(A) to 5(C). The experiment was made to form a semiconductor device in which are digged a cave in a trench to increase the capacitance formed in the trench.

The trench was formed with the depth of 5 micron meters and with the width of 2.5 micron meters at the upper portion and of 1.5 micron meters at the bottom portion, with a silicon nitride 2 and silicon oxide 2' as a mask as shown FIG. 5(A). Thereafter a silicon nitride layer 45 and 45' was deposited by CVD method using light irradiation.

Then the silicon nitride layer was let undergo an anisotoropic etching to remove selectively the upper layer 45' and the part of the layer 45 formed on the bottom portion 39 of the trench 3. Further, for the substrate 1, an anisotropic etching was carried out to perform a lateral etching so that a cave 40 is digged.

After removing the silicon oxide layer 2' and the silicon nitride layer 2, a silicon oxide layer 41 was deposited on the insides of the cave 40, the trench 3 and the surface of the semiconductor substrate 1 according to the method same as the preceding. Further on the layer 41 are formed a titanium silicide layer or silicon layer 42 which is doped with phosphorus, an insulating layer 4 such as silicon oxide or silicon nitride and a conductive layer 5 such as a polycrystalline silicon or titanium silicide layer which is doped with phosphorus, each layer being fabricated by CVD method according to the invention. Thereafer, a silicon oxide 46 was superimposed on the laminate over the trench 3 so as completely to stop the trench. During the process, contacts 44 and 43 were defined by photolithgraphy. Consequently, a improved semiconductor device was obtained with large capacitance.

While the present invention has been described with reference to several preferred embodiments thereof, many variations and modifications will now occur to those skilled in the art. It is our intent, therefore, to be limited solely by the scope of the appending claims and not by the specific embodiments disclosed herein.

What is claimed is:

1. A method for coating, with a uniform film, the surface of a substrate and a depression formed on said surface having a width less than 2.5 micron meters, comprising the steps of:
    disposing said substrate in a reaction chamber;
    inputting a reactive gas to said reaction chamber;
    irradiating said reactive gas with light to initiate optical reaction and depositing the product on the surface of said substrate, more than half of the exciting energy of said product being attributed to said irradiation, whereby the inside of said trench is coated with a uniform film by virtue of surface migration.

2. A method of claim 1 wherein the depth of said depression is larger than the width thereof.

3. A method of claim 1 wherein the temperature of the surface to be coated by the deposition is less than 400° C.

4. A method of claim 1 wherein the depth of the trench is at least three times as great as the width of its opening.

* * * * *